(12) United States Patent
Tanzer et al.

(10) Patent No.: US 6,229,691 B1
(45) Date of Patent: May 8, 2001

(54) APPARATUS AND METHOD FOR MOUNTING A POWER DISTRIBUTION UNIT WITHIN AN EQUIPMENT ENCLOSURE

(75) Inventors: Herbert J Tanzer, Folsom; Brian S. Tsuyuki, Roseville; Kenneth T Small, Cupertino; Carl R. Haynie, Pilot Hill, all of CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/192,397

(22) Filed: Nov. 13, 1998

(51) Int. Cl.[7] ...................................................... H02B 1/02
(52) U.S. Cl. .......................... 361/622; 361/610; 439/534
(58) Field of Search .................................. 439/534, 954; 379/325–332; 361/601, 610, 622, 641, 724–727, 822, 823, 824, 829, 826–828; 16/115, 124

(56) References Cited

U.S. PATENT DOCUMENTS

| | | | |
|---|---|---|---|
| 3,580,412 | * | 5/1971 | Weiss . |
| 3,780,351 | * | 12/1973 | Salmon . |
| 3,784,728 | * | 1/1974 | De Bortoli . |
| 4,414,706 | * | 11/1983 | Douglas . |
| 4,823,381 | * | 4/1989 | Olson . |
| 5,253,140 | * | 10/1993 | Inoue . |
| 5,639,261 | * | 6/1997 | Rutkowski . |
| 5,789,828 | * | 8/1998 | Tremaine . |
| 6,028,267 | * | 2/2000 | Byrne . |

* cited by examiner

Primary Examiner—Gerald Tolin
(74) Attorney, Agent, or Firm—Denise A. Lee

(57) ABSTRACT

A power distribution unit adapted for mounting within an equipment enclosure including an inner rack. The power distribution unit includes at least one mounting hinge that is fixedly attached to the power distribution unit housing and which is adapted to fixedly mount the power distribution unit to the rack columns. The mounting hinge is pivotable such that the power distribution unit can be pivoted to an extended position to facilitate removal of removable modules of the equipment components mounted within the equipment enclosure.

19 Claims, 7 Drawing Sheets

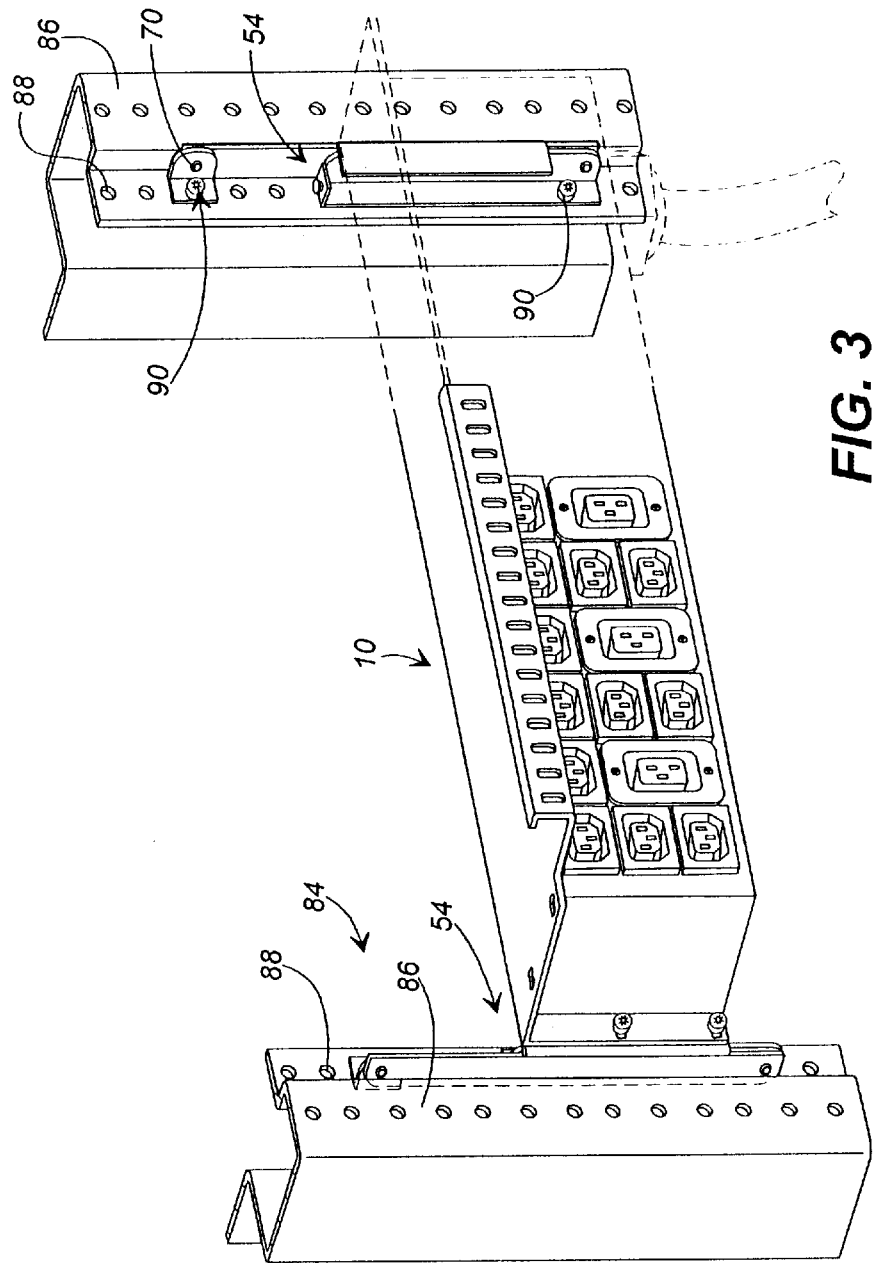
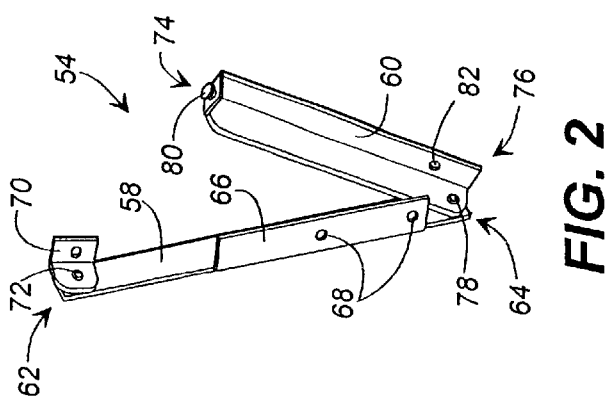

APPARATUS AND METHOD FOR MOUNTING A POWER DISTRIBUTION UNIT WITHIN AN EQUIPMENT ENCLOSURE

FIELD OF THE INVENTION

The invention relates generally to apparatus and methods for mounting equipment within an equipment enclosure. More particularly, the invention relates to such apparatus and methods for mounting a power distribution unit that provide for improved serviceability of equipment enclosure components and improved cable management.

BACKGROUND OF THE INVENTION

Typically, computer and data storage equipment is housed in standardized equipment enclosures. These equipment enclosures normally comprise an outer, aesthetically pleasing housing which is supported by an inner rack. The rack usually comprises a substantially rectilinear metal frame including several vertical columns each provided with a plurality of mounting and alignment holes which permit the mounting of various equipment hardware to the rack. The individual components mounted inside the equipment enclosure typically are supported by support rails that mount to the columns of the rack. The components supported by the rails normally are supplied with power by power distribution units that mount to the rear columns of the rack. The power distribution units comprise a plurality of electrical receptacles to which the electrical plugs of the various components can be coupled.

Recently, there have been increased efforts in the industry to maximize equipment packing density within equipment enclosures. These efforts have resulted in an increased number of components that require current being housed within the equipment enclosures. Conventional power distribution units do not have the current carrying capacity needed to satisfy the demands of these new systems. Notably, this deficiency often cannot be remedied by the use of additional known distribution units due to the limited rear column space of the equipment enclosures and the limited space between the rear columns and the outer enclosure housing.

In addition to these current capacity problems, conventional power distribution units also create usability problems. In particular, conventional power distribution units impede online field replacement of component modules such that inoperative or malfunctioning modules cannot be quickly removed from the rear of the enclosure without shutting the system down. Specifically, known power distribution units encroach upon the horizontal equipment envelope of the enclosure, physically inhibiting module removal. To replace these modules in such systems, the entire power distribution unit must be removed from the rack, creating risks of electrical plug disconnection and even electrical shock to the technician.

Another usability problem associated with conventional power distribution units concerns cable management. As identified above, typical power distribution units have relatively low current carrying capacity. This means that several such power distribution units are necessary to supply the current needed to operate the many components contained within the equipment enclosure. Even in situations in which several such power distribution units fit within the enclosure, cable management is difficult in that several power cords must be routed from the equipment components to the several power distribution units within the enclosure as well as from the power distribution units to the current source of the room in which the enclosure is located. In addition to creating confusing tangles of power cords within the enclosure, such arrangements create current supply problems where the number of current outlets in the room are limited.

From the above, it can be appreciated that it would be desirable to have a power distribution unit which avoids the above-identified problems.

SUMMARY OF THE INVENTION

Briefly described, the present invention relates to a power distribution unit adapted for mounting within an equipment enclosure including an inner rack. The power distribution unit comprises a housing having a plurality of plug receptacles mounted thereto that are adapted to couple with power plugs of the various equipment components mounted within the equipment enclosure. The power distribution unit further includes at least one mounting hinge that is fixedly attached to the power distribution unit housing and which is adapted to fixedly mount the power distribution unit to the rack columns. The mounting hinge is pivotable such that the power distribution unit can be pivoted outwardly with respect to the rack to an extended position to facilitate removal of removable modules of the equipment component.

In one preferred embodiment of the power distribution unit, a pair of mounting hinges are used, one mounting hinge being fixedly attached to each end of the power distribution unit housing and each mounting hinge being adapted to fixedly mount to a column of the rack. Arranged in this manner, the power distribution can be mounted in a horizontal orientation and pivoted about a horizontal axis such that the power distribution unit can be swung outwardly with respect to the rack to an extended position to facilitate removal of removable modules of the equipment component.

In another preferred embodiment of the power distribution unit, a single mounting hinge is fixedly attached to one of the sides of the housing and is adapted to fixedly mount to a column of the rack in a manner such that the power distribution is arranged in a vertical orientation. The mounting hinge therefore can be pivoted about a horizontal axis such that the power distribution unit can be swung laterally with respect to the rack to an extended position to facilitate removal of removable modules of the equipment component.

Moreover, the invention relates to a method for providing for displacement of a power distribution unit mounted to an equipment enclosure rack to facilitate removal of equipment component modules mounted within the equipment enclosure, the method comprising the steps of mounting the power distribution unit to at least one mounting hinge that is pivotable from a locked-down position to an extended position, and mounting the mounting hinge to a column of the equipment enclosure rack such that the mounting hinge can pivot from the locked-down position to the extended position relative to the equipment enclosure rack to similarly position the power distribution unit in a locked-down position during normal operation and an extended position when the individual modules of the various equipment components are to be removed.

The particular objects, features, and advantages of this invention will become more apparent upon reading the following specification, when taken in conjunction with the accompanying drawings. It is intended that all such additional features and advantages be included therein with the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

FIG. 2 is a perspective view of the mounting hinge shown in FIG. 1.

FIG. 3 is a perspective view of the power distribution unit and mounting apparatus of FIG. 1, shown mounted to a rack in a locked-down position.

DETAILED DESCRIPTION

Figure 1:
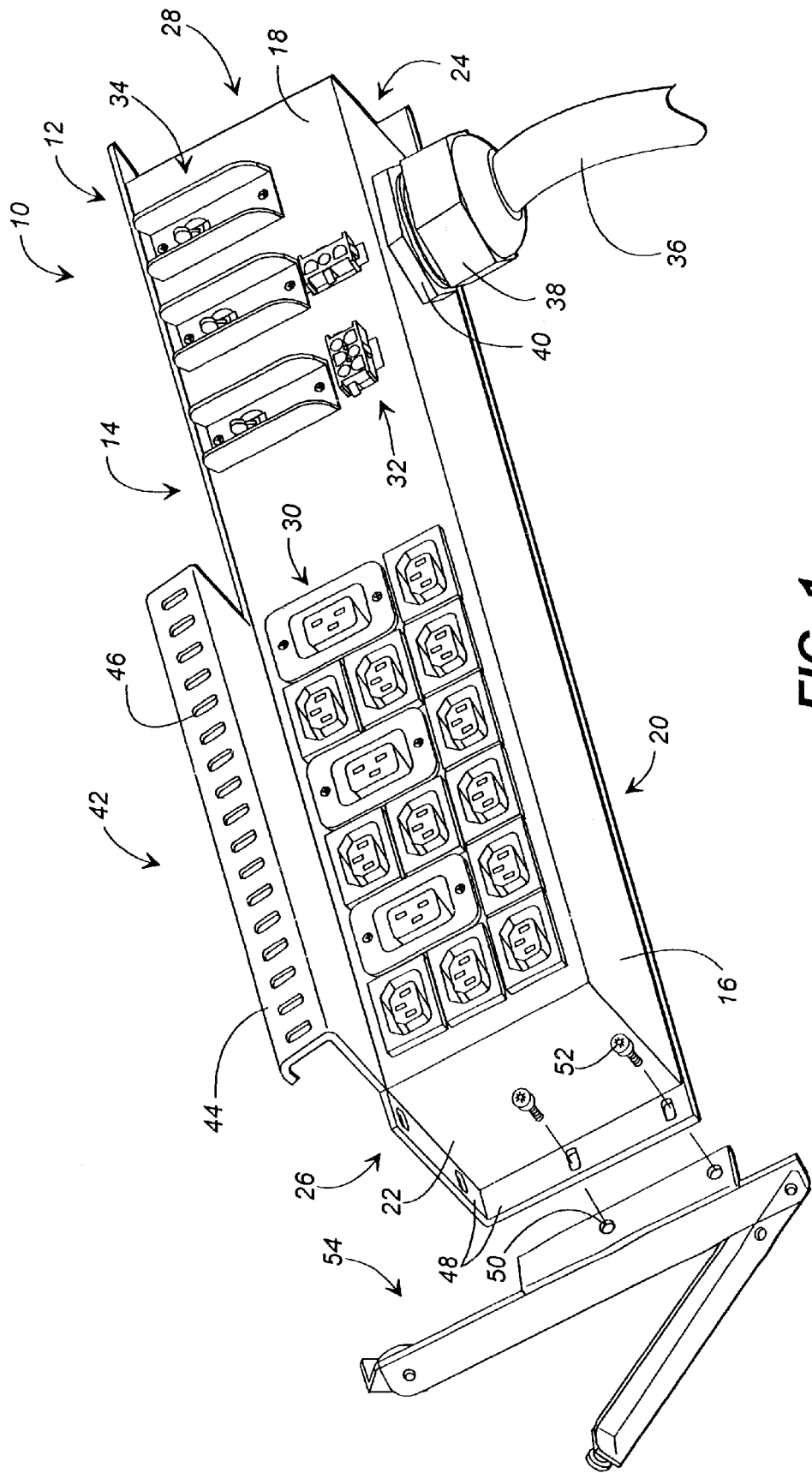
FIG. 1 is an exploded perspective view of a first embodiment of a power distribution unit and mounting apparatus constructed in accordance with the present invention.

Referring now in more detail to the drawings, in which like reference numerals indicate corresponding parts throughout the several views, FIGS. 1–4 illustrate a first embodiment of a power distribution unit and mounting apparatus constructed in accordance with the present invention.

As shown in FIG. 1, the power distribution unit 10 comprises an outer housing 12 which contains internal circuitry (not shown). Normally, the power distribution unit 10 has either a 30 or 60 ampere capacity, although it will be appreciated that the unit could have other current capacities, if desired. Shown in FIGS. 1–4, by way of example only, is a 60 ampere unit. The housing 12 is elongated and rectilinear in shape and includes a top side 14, a bottom side 16, a front side 18, a rear side 20, first and second lateral sides 22 and 24, and first and second ends 26 and 28. The housing 12 is normally constructed of a substantially rigid material such as a metal material and is approximately 19 inches in length so as to be adapted to mount within a standard 19 inch rack. Provided in the front side 18 of the housing 12 is a plurality of electrical receptacles 30 that are adapted to receive the electrical plugs of the components contained within the equipment enclosure. As is evident from FIG. 1, the receptacles 30 are arranged in a tightly packed configuration within the front side 18 of the power distribution unit housing 12 such that a large number of components can be coupled with the power distribution unit 10 to receive current. Also typically provided in the front side 18 of the housing 12 is a plurality of relays 32 and a plurality of circuit breakers 34. The relays 32 are electrically connected to a main power switch (not shown) of the equipment enclosure which can be used to turn the entire system power on and off. As known in the art, the circuit breakers 34 shut-off the supply of current when an electrical surge occurs.

Connected to the bottom side 16 of the housing 12 is a power cable 36 which is adapted to couple with a current outlet provided in the room in which the equipment enclosure is located. The power cable 36 connects to the housing 12 with a first fastening member 38 that is sized and configured to mate with a second fastening member 40 that is fixedly mounted to the bottom side 16 of the housing. The power distribution unit housing 12 further includes a cable tie-down device 42 that extends outwardly from the top side 14 of the housing so as to extend beyond the front side 18 of the housing. Although capable of myriad alternative configurations, the tie-down device 42 normally is unitarily formed with the top side 14 of the housing 12 and includes a tie-down bar 44 that is formed at the distal end of the tie-down device. The tie-down bar 44 includes a plurality cable tie openings 46 which are adapted to receive cable ties with which the component electrical cables can be tied to the tie-down bar. Extending outwardly from the top and rear sides 14 and 20 of the housing 12 are mounting flanges 48 which include mounting holes that are adapted to receive fasteners 52 that are used to attach the power distribution unit 10 to the enclosure rack with mounting hinges 54.

The mounting hinges 54 are depicted in detail in FIG. 2. Each of the mounting hinges 54 comprises a pivot arm 58 and a support arm 60. The pivot arm 58 has first and second ends 62 and 64 and a mounting flange 66 to which the power distribution unit housing 12 can be attached. The mounting flange 66 includes mounting holes 68 that align with the mounting holes 50 of the power distribution unit mounting flanges 48. Pivotally connected to the first end 62 of the pivot arm 58 is a mounting tab 70 that is used to fixedly attach the mounting hinge 54 to the enclosure rack. Typically, the mounting tab 70 is connected to the pivot arm 58 with a rivet 72 or other fastener about with the pivot arm 58 can freely rotate relative to the mounting tab 70.

Similar to the pivot arm 58, the support arm 60 has first and second ends 74 and 76. Typically, the second end 76 of the support arm 60 is pivotally connected to the second end 64 of the pivot arm 58 with a rivet 78 or other fastener about which the support arm can freely rotate relative to the pivot arm. Positioned at the first end 74 of the support arm 60 is a catch tab 80 that, as is discussed below, helps maintain the power distribution unit 10 in an extended position. Normally, the catch tab 80 is formed as a resilient grommet. The support arm 60 typically further comprises a lock-down hole 82 that is used to secure the power distribution unit 10 in a locked-down position in the equipment enclosure (FIG. 3).

Having described the primary structural components of the power distribution unit and mounting apparatus of the first embodiment, use of the power distribution unit in an equipment disclosure will be described with particular reference to FIGS. 3 and 4. FIG. 3 depicts the power distribution unit 10 mounted to an equipment enclosure rack 84 in a horizontal orientation in the locked-down position. As shown in this figure, the rack 84 comprises at least two vertical columns 86 which include a plurality of mounting holes 88. The power distribution unit 10 is supported by the mounting hinges 54. Specifically, the mounting tabs 70 connected to the pivot arms 58 are fixedly connected to the rack columns 86 with fasteners 90 such as screws or bolts. The support arms 60 are pivoted upwardly so as to be in folded positions in with the first ends 74 of the support arms 60 adjacent the first ends 62 of their adjacent pivot arms as depicted most clearly in FIG. 3. In these folded positions, the support arms 60 can be fixedly connected to the rack column 86 with additional fasteners 90 that extend through the lock-down holes 82. With the mounting hinges 54 firmly affixed to the rack columns 86 in this manner, the power distribution unit 10 is securely locked-down to the enclosure rack 84 such that the power distribution unit will not swing outwardly during shipment or other movement of the equipment enclosure.

Figure 4:
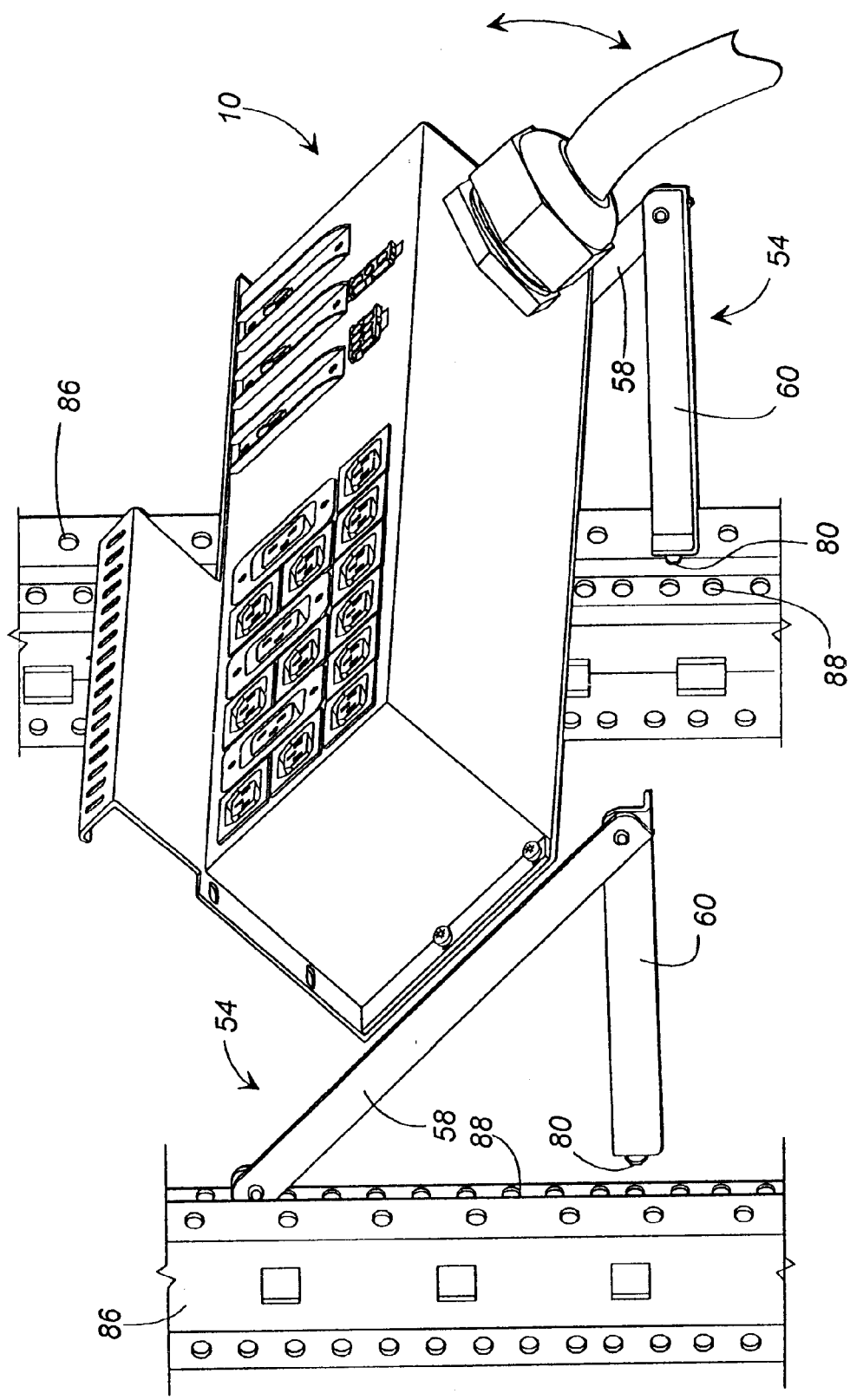
FIG. 4 is a perspective view of the power distribution unit and mounting apparatus of FIGS. 1 and 3, shown mounted to a rack in an extended position.

FIG. 4 depicts the power distribution unit 10 in the extended position. To permit the power distribution unit 10 to pivot to this extended position, the fasteners 90 that extend through the lock-down holes 82 of the support arms 60 shown in FIG. 3 are first removed. Once removed, the technician can swing the power distribution unit 10 outwardly and upwardly as shown in FIG. 4. The power distribution unit 10 can then be supported in the extended position with the support arms 60. In particular, the support arms 60 are pivoted about the pivot arm 58 such that the support arms are substantially perpendicular to the rack columns 86. The catch tabs 80 then can be inserted in appropriate mounting holes 88 of the columns 86 to hold the power distribution unit 10 in the extended position. Once the power distribution unit 10 is supported in the extended position, adequate space is provided for online field replacement of the component modules.

Figure 5:
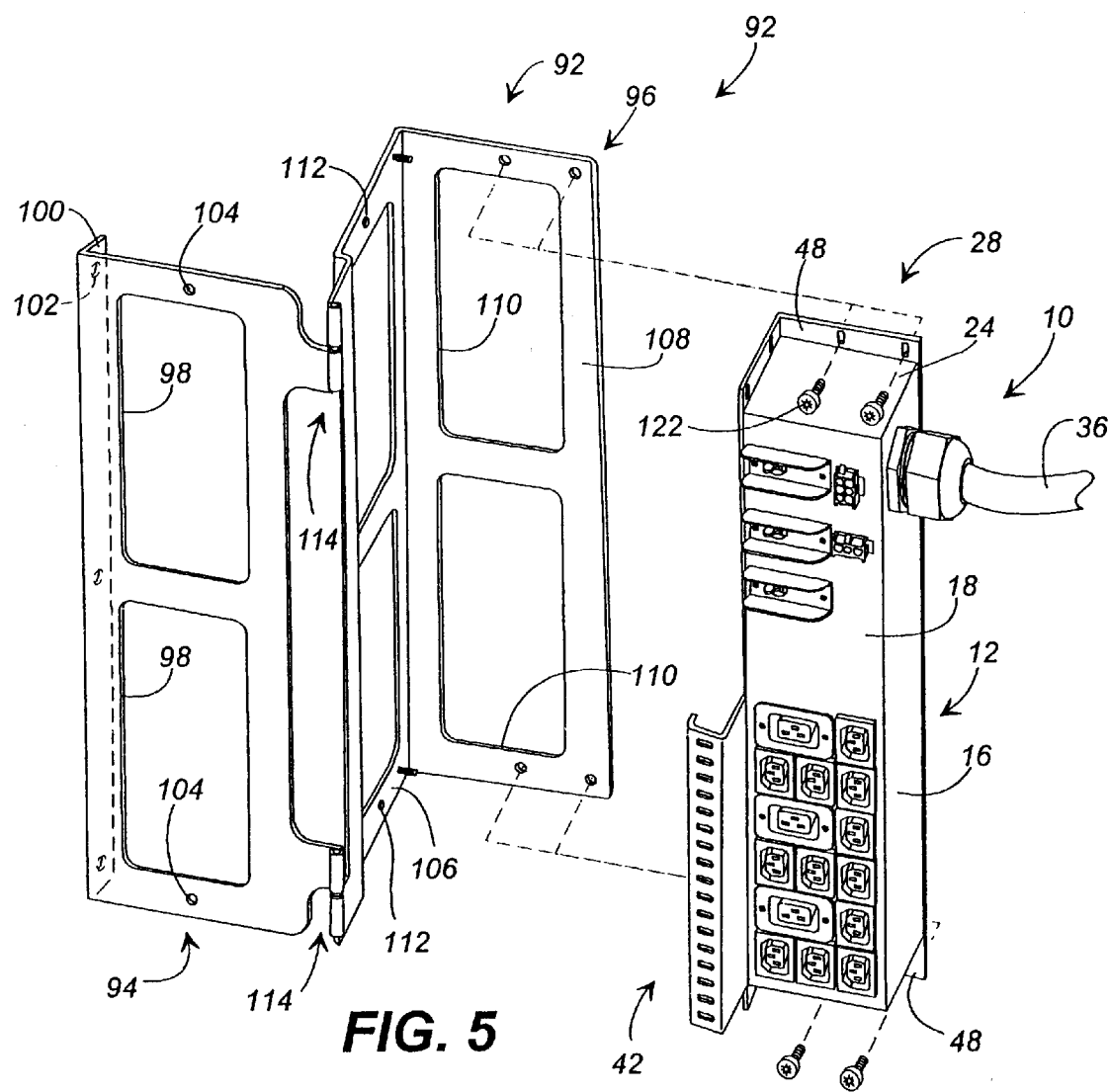
FIG. 5 is an exploded perspective view a second embodiment of a power distribution unit and mounting apparatus constructed in accordance with the present invention.
Figure 6:
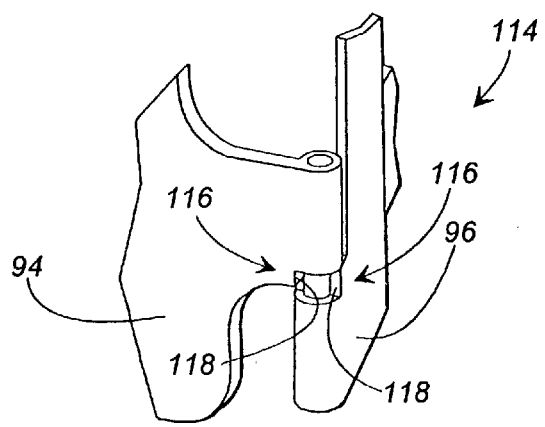
FIG. 6 is a perspective view of a cammed hinge shown in FIG. 5.

FIGS. 5–9 illustrate a second embodiment of a power distribution unit and mounting apparatus constructed in accordance with the present invention. Shown in FIG. 5 is a power distribution unit 10 similar in construction to that described above in reference to the first embodiment shown in FIGS. 1–4. Because of the detailed description of the power distribution unit 10 provided above, the power distribution unit will be described in brief with emphasis instead being placed upon the mounting apparatus. As is apparent from FIGS. 5–9, a 60 ampere unit is depicted, by way of example.

As identified above, the power distribution unit 10 comprises an outer housing 12 that includes a top, bottom, front, rear, and lateral sides 14–24 as well as first and second ends 26 and 28. Connected to the bottom side 16 of the housing 12 is a power cable 36 which is adapted to couple with a current outlet provided in the room in which the equipment enclosure is located. The power distribution unit housing 12 further includes a cable tie-down device 42 that extends outwardly from the top side 14 of the housing.

As indicated in FIG. 5, the power distribution unit and mounting apparatus of the second embodiment includes a mounting hinge 92. Unlike the mounting hinges 54 of the first embodiment, the mounting hinge 92 of the second embodiment is adapted to mount the power distribution unit 10 in a vertical orientation. The mounting hinge 92 generally comprises first frame member 94 that is adapted to fixedly mount to an enclosure rack and a second frame member 96 that is adapted to pivot relative to the first frame member. Although capable of alternative construction, the first and second frame members 94 and 96 typically are unitarily formed from single pieces of material such as cold-rolled steel.

The first frame member 94 is substantially planar in shape and normally includes relatively large cut-out areas 98 which reduce the amount of material used to fabricate the mounting hinge 92. Normally extending perpendicularly from the first frame member 94 is a mounting flange 100 which includes a plurality of mounting holes 102 with which the mounting hinge 92 is attached to the enclosure rack. The first frame member 94 further includes a first pair of lock-down holes 104, the purpose for which is discussed below.

The second frame member 96 comprises adjacent and distal portions 106 and 108. The two portions 106, 108 normally are substantially planar in shape and are arranged perpendicularly to each other so as to be substantially L-shaped. Like the first frame member 94, the adjacent and distal portions 106 and 108 of the second frame member 96 each comprise relatively large cut-out areas 110. Provided in the adjacent portion 106 is a second pair of lock-down holes 112 that aligns with the first pair of lock-down holes 104 of the first frame member 94 when the power distribution unit 10 is in a locked-down position.

Figure 7:
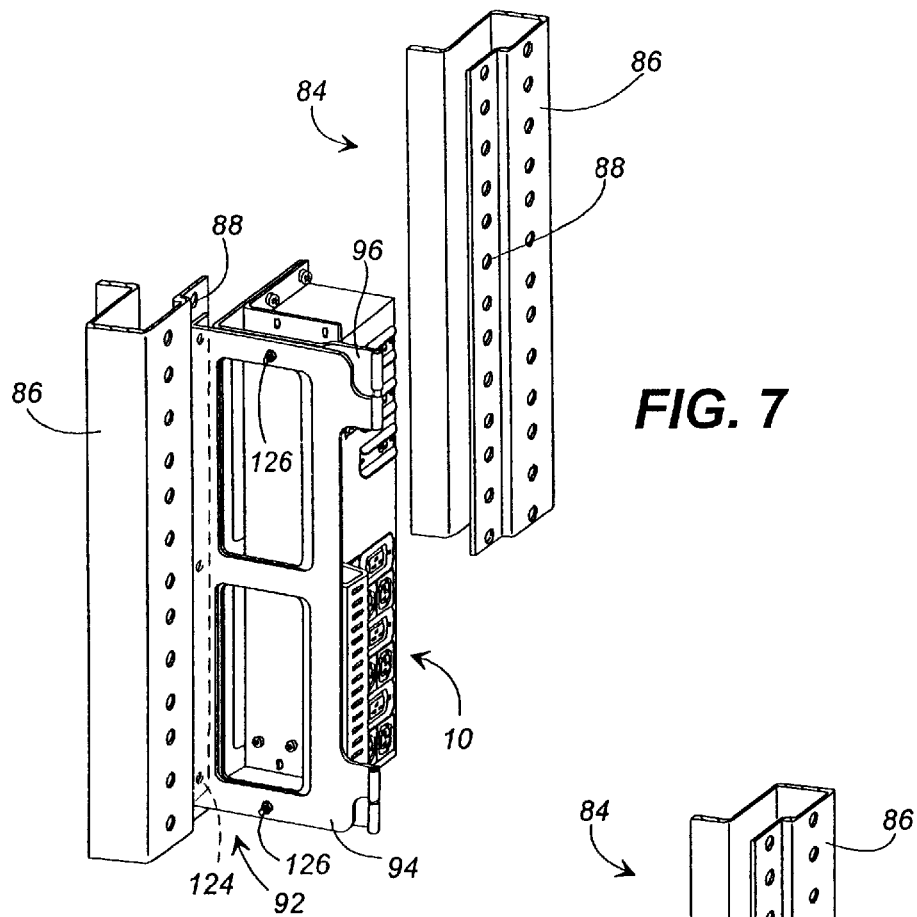
FIG. 7 is a perspective view of the power distribution unit and mounting apparatus of FIG. 5, shown mounted to a rack in a locked-down position.
Figure 8:
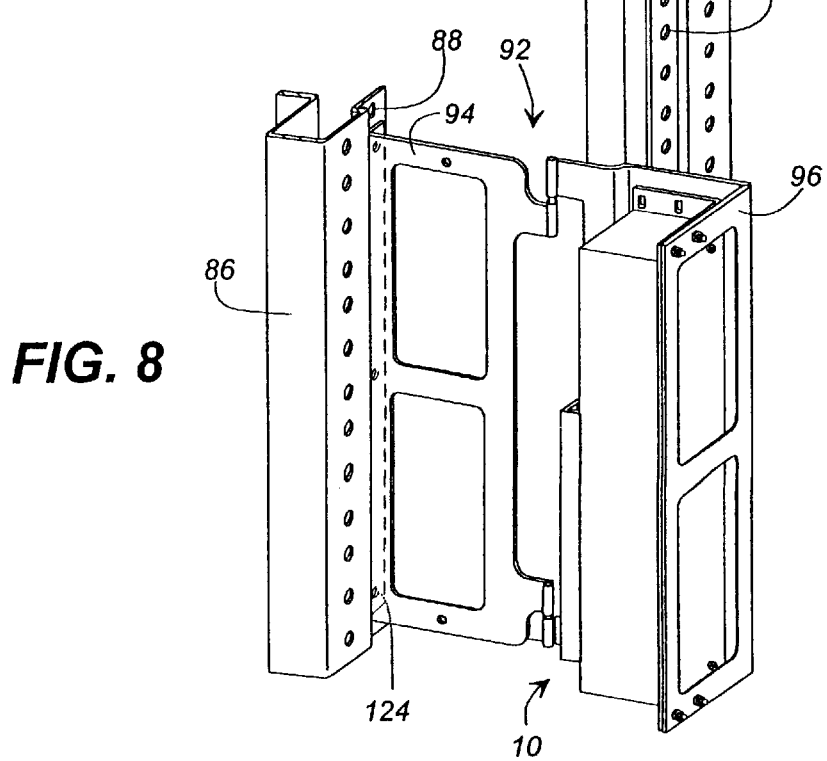
FIG. 8 is a perspective view of the power distribution unit and mounting apparatus of FIGS. 5 and 6, shown mounted to a rack in an extended position.

The second frame member 96 pivotally mounts to the first frame member 94 with at least one lock hinge 114. As shown most clearly in FIG. 6, the lock hinges 114 comprise cut-out portions 116 which permit the mounting hinge to lock in the extended position (FIG. 8). In particular, the cut-out portions 116 are arranged such that the second frame member 96 can drop down relative to the first frame member 96 such that the leading edges 118 of the portions mate with each other. Once locked, the mounting hinge 92 will remain in the extended position until the user lifts the second frame member 96 up and pivots it toward the locked-down position (FIG. 7).

As indicated in FIG. 5, the power distribution unit 10 fixedly mounts to the second frame member 96 of the mounting hinge 92. In particular, the power distribution unit 10 directly mounts to the distal portion 108 of the second frame member 96 with a plurality of fasteners 122 such as screws or bolts.

Having described the primary structural components of the power distribution unit and mounting apparatus of the second embodiment, use of the power distribution unit in an equipment disclosure will be described with particular reference to FIGS. 7 and 8. FIG. 7 depicts the power distribution unit 10 mounted to an equipment enclosure rack 84 similar to that described above with respect to the first embodiment. The mounting hinge 92 is mounted to the rack columns 86 with fasteners 124 such as screws or bolts that extend into the columns 86 through the holes 102 of the mounting flanges 100 such that the power distribution unit is in a vertical orientation. In the locked-down position shown in FIG. 6, the adjacent portion 106 of the second frame member 96 is positioned adjacent the first frame member 94. The second frame member 96 is securely held in this position with fasteners 126 such as a screw or bolt that extends through the first and second pairs of lock-down holes 104 and 112 of the first and second frame members 94 and 96. When the fasteners 126 are fully tightened, the distribution unit 10 cannot swing outwardly when the equipment enclosure is moved.

FIG. 8 depicts the power distribution unit 10 in the extended position. To arrange the power distribution unit 10 in this extended position, the fasteners 126 that extend through the lock-down holes 104 and 112 of the first and second frame members 94 and 96 shown in FIG. 7 are removed. Once removed, the technician can swing the power distribution unit 10 outwardly as shown in FIG. 8. Once the power distribution unit 10 is in the extended position and locked in place as described above, adequate space is provided for online field replacement of the component modules.

Figure 9:
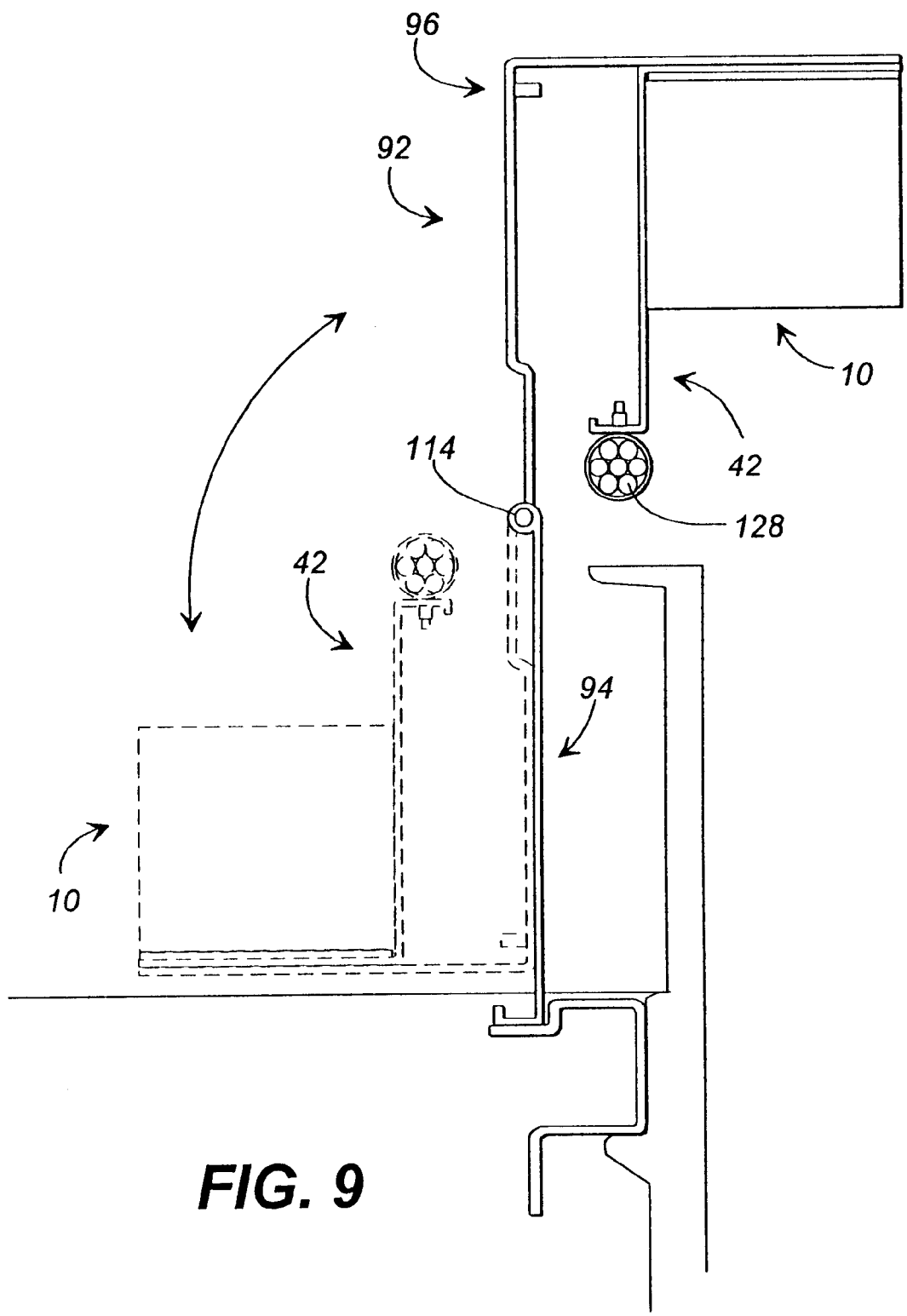
FIG. 9 is a top view of the power distribution unit and mounting apparatus of FIGS. 5–7, depicting management of cables tied to the power distribution unit.

As indicated in FIG. 9, the configuration of the mounting apparatus of the second embodiment provides for advantageous cable management. In particular, the cables 128 are tied to the tie-down device 42 in a vertical orientation and are displaced only to a small degree between the locked-down and extended positions to both minimize the cable service loop needed to extension of the power distribution device 10 and to reduce the torsional forces imparted to the cables during this extension.

Figure 10:
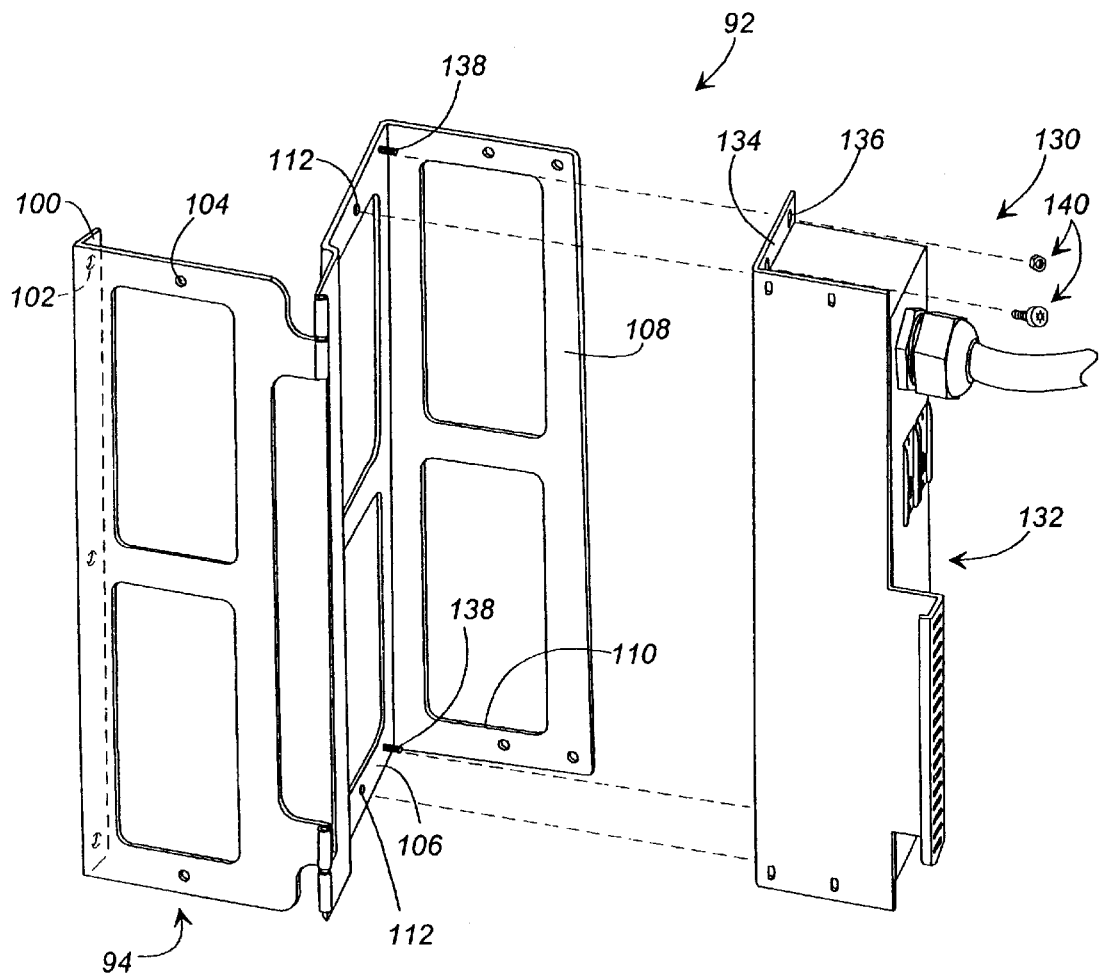
FIG. 10 is an exploded perspective view of an alternative mounting arrangement of a power distribution unit to the mounting apparatus shown in FIG. 5.

FIG. 10 illustrates an alternative mounting arrangement for an alternative power distribution unit 130. By way of example, the power distribution unit 130 is a 30 ampere unit. As indicated in the figure, the power distribution unit comprises a housing 132 which includes mounting flanges 134 that have mounting holes 136. One pair of the mounting holes 136 align with mounting studs 138 provided on the adjacent portion 106 of the second frame member 96 of the mounting hinge 92, and another pair of the mounting holes align with the second pair of lock-down holes 112 provided in the adjacent portion. Arranged in this manner, the power distribution unit 130 can mount to the mounting hinge 92 with conventional fasteners 140 such as screws or bolts and nuts. When the power distribution unit 130 is not in the locked-down position, the fasteners 140 are removed from the second pair of lock-down holes 112 such that the power distribution unit is supported solely by the mounting studs 138.

While preferred embodiments of the invention have been disclosed in detail in the foregoing description and drawings, it will be understood by those skilled in the art that variations and modifications thereof can be made without departing from the spirit and scope of the invention as set forth in the following claims.

Therefore, the following is claimed:

1. A power distribution unit mounted within an equipment enclosure including an inner rack having columns, the power distribution unit comprising:

a housing having a number of sides including a first side and a second side;

a plurality of power output connectors mounted to the first side of the housing, the power output connectors adapted to couple with, and distribute electrical power to, conducting elements that electrically interconnect the power distribution unit with various equipment components mounted within the equipment enclosure;

a power input port in the second side of the housing for input of electrical power to the power distribution unit; and at least one mounting hinge, the at least one mounting hinge fixedly attached to the power distribution unit housing and fixedly mounted to the columns of the inner rack such that the power distribution unit is pivotable and movable from a first position in which the power distribution unit is flush to the inner rack and obstructs access to equipment components behind the power distribution unit to a second extended position in which the power distribution unit is translated away from the inner rack to allow access to the equipment components.

2. The power distribution unit of claim 1, wherein the at least one mounting hinge mounts the power distribution unit to the inner rack in a horizontal orientation.

3. The power distribution unit of claim 2, wherein the at least one mounting hinge is pivotable about a horizontal axis such that the power distribution unit is pivotable upwardly and outwardly with respect to the inner rack.

4. The power distribution unit of claim 1, wherein the at least one mounting hinge mounts the power distribution unit to the inner rack in a vertical orientation.

5. The power distribution unit of claim 4, wherein the at least one mounting hinge is pivotable about a vertical axis such that the power distribution unit can be pivoted laterally and outwardly with respect to the inner rack.

6. A power distribution unit mounted within an equipment enclosure including an inner rack having at least one column, the power distribution unit comprising:

a housing having first and second ends;

a plurality of power output connectors mounted to the housing, the power output connectors adapted to couple with, and distribute electrical power to, conducting elements that electrically interconnect the power distribution unit with various equipment components mounted within the equipment enclosure;

a power input port in the housing for input of electrical power to the power distribution unit; and a pair of mounting hinges, one of the mounting hinges fixedly attached to each end of the power distribution unit housing, each mounting hinge fixedly mounted to a column of the inner rack in a manner such that the power distribution unit is mounted in a horizontal orientation the and is pivotable about a horizontal axis such that the power distribution unit is pivotable and movable from a first position in which the power distribution unit is flush to the inner rack and obstructs access to equipment components behind the power distribution unit to a second extended position in which the power distribution unit is translated away from the inner rack to allow access to the equipment components.

7. The power distribution unit of claim 6, wherein each mounting hinge comprises a pivot arm having first and second ends and a support arm having first and second ends, the second end of the support arm being pivotally connected to the second end of the pivot arm, the support arm supporting the power distribution unit in the extended position.

8. The power distribution unit of claim 7, wherein the pivot arm includes a mounting flange to which the power distribution unit housing is fixedly connected.

9. The power distribution unit of claim 7, wherein the mounting hinge further includes a mounting tab that is pivotally connected to the first end of the pivot arm, the mounting tab fixedly mounted to the inner rack column.

10. The power distribution unit of claim 7, wherein the support arm includes a lock-down hole with which the power distribution unit can be secured to the inner rack in a locked-down position.

11. The power distribution unit of claim 7, wherein the mounting hinge further includes a catch tab that is attached to the first end of the support arm.

12. The power distribution unit of claim 6, further comprising a cable tie-down device mounted to the housing.

13. A power distribution unit mounted within an equipment enclosure including an inner rack having at least one column, the power distribution unit comprising:

a housing having a plurality of sides including a first side and a second side;

a plurality of power output connectors mounted to the first side of the housing, the power output connectors adapted to couple with, and distribute electrical power to, conducting elements that electrically interconnect the power distribution unit with various equipment components mounted within the equipment enclosure;

a power input port in the second side of the housing for input of electrical power to the power distribution unit; and a mounting hinge, the mounting hinge fixedly attached to one of the sides of the housing and fixedly mounted to a column of the inner rack in a manner such that the power distribution unit is mounted in a vertical orientation, the mounting hinge pivotable about a vertical axis such that the power distribution unit is pivotable laterally with respect to the inner rack and movable from a first position in which the power distribution unit is flush to the inner rack and obstructs access to equipment components behind the power distribution unit to a second extended position in which the power distribution unit is translated away from the inner rack to allow access to the equipment components.

14. The power distribution unit of claim 13, wherein the mounting hinge comprises a first frame member and a second frame member, the first and second frame members being pivotally connected to each other.

15. The power distribution unit of claim 14, wherein the first and second frame members are connected with at least one lock hinge that locks the power distribution unit in the extended position.

16. The power distribution unit of claim 14, wherein the mounting hinge further includes a mounting flange that is fixedly mounted to the inner rack.

17. The power distribution unit of claim 14, wherein the second frame member includes an adjacent portion and a distal portion that are substantially perpendicular to each other.

18. The power distribution unit of claim 14, wherein the first frame member includes a first pair of lock-down holes and the second frame member includes a second pair of lock-down holes, the first and second pairs of lock-down holes being arranged so as to align when the power distribution unit is in a locked-down position.

19. The power distribution unit of claim 13, further comprising a cable tie-down device mounted to the housing.

* * * * *

UNITED STATES PATENT AND TRADEMARK OFFICE
CERTIFICATE OF CORRECTION

PATENT NO.    : 6,229,691 B1
DATED         : May 8, 2001
INVENTOR(S)   : Tanzer et al.

It is certified that error appears in the above-identified patent and that said Letters Patent is hereby corrected as shown below:

<u>Column 8,</u>
Line 26, after "orientation" delete "the"

Signed and Sealed this

Thirty-first Day of December, 2002

JAMES E. ROGAN
*Director of the United States Patent and Trademark Office*